United States Patent
Sukharev

(12) 
(10) Patent No.: US 6,524,974 B1
(45) Date of Patent: Feb. 25, 2003

(54) FORMATION OF IMPROVED LOW DIELECTRIC CONSTANT CARBON-CONTAINING SILICON OXIDE DIELECTRIC MATERIAL BY REACTION OF CARBON-CONTAINING SILANE WITH OXIDIZING AGENT IN THE PRESENCE OF ONE OR MORE REACTION RETARDANTS

(75) Inventor: Valeriy Sukharev, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/274,254

(22) Filed: Mar. 22, 1999

(51) Int. Cl.$^7$ .................. H01L 21/31; H01L 21/469
(52) U.S. Cl. .................. 438/787; 438/789; 438/790
(58) Field of Search .................. 438/787, 789, 438/790; 427/255.18, 255.27, 255.37

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A * | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |

(List continued on next page.)

FOREIGN PATENT DOCUMENTS

| DE | 198 04 375 A1 | 7/1999 | H01L/21/312 |
|---|---|---|---|
| EP | 0 706 216 A2 | 4/1996 | H01L/23/532 |
| EP | 0 949 663 A2 | 10/1999 | H01L/21/312 |
| JP | 63003437 | 1/1988 | H01L/21/90 |
| JP | 2000-267128 | 9/2000 | G02F/1/136 |
| WO | WO99/41423 | 8/1999 | |

OTHER PUBLICATIONS

Arutyunyan, A. Zh., et al., "Formation of Radicals on the Surface of Oxides During Decomposition of $H_2O_2$", *Kinetics Catalysis*, vol. 29, No. 2, 1989, pp. 754–758.

Babushok, V., et al., "Inhibition of Silane Ignition by Iodine Containing Additives", *Annual Conference on Fire Research Book of Abstracts*, Nov. 2–5, 1998, pp. 125–126.

Britten, Jerald A., et al., "A Numerical Study of Silane Combustion", *Twenty–Third Symposium (International) on Combustion*, Jul. 22–27, 1990, pp. 195–202.

(List continued on next page.)

Primary Examiner—Alexander Ghyka
(74) Attorney, Agent, or Firm—John P. Taylor

(57) ABSTRACT

An improvement in the formation of low dielectric constant carbon-containing silicon oxide dielectric material by reacting a carbon-substituted silane with an oxidizing agent is described, wherein the process is carried out in the presence of a reaction retardant. The reaction retardant reduces the sensitivity of the reaction to changes in pressure, temperature, and flow rates, and reduces the problem of pressure spiking, resulting in the formation of a deposited film of more uniform thickness across the substrate as well as a film with a smooth surface, and a reduction of the amount of carbon lost during the reaction. The reaction retardant is selected from the group consisting of: 1) an inorganic compound selected from the group consisting of: $Cl_2$, $Br_2$, $I_2$, HF, HCl, HBr, HI, NO, $NO_2$, $N_2O$, $H_2S$, CO, $CO_2$, $NH_3$, and SO; 2) an organic compound selected from the group consisting of: a 1–6 carbon alkane, a 1–6 carbon alkene, a 1–6 carbon alkyne, a 1–ketone, a 1–6 carbon carboxylic acid, a 1–10 carbon aromatic, any of the above organic compounds having one or more atoms therein selected from the group consisting of Cl, Br, I, S, N, and P; and 3) mixtures of 2 or more of the above.

10 Claims, 1 Drawing Sheet

U.S. PATENT DOCUMENTS

| | | | |
|---|---|---|---|
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,232,658 B1 | 5/2001 | Catabay et al. | 257/701 |

OTHER PUBLICATIONS

Dobson, C.D., et al., "Advanced $SiO_2$ Planarization Using Silane and $H_2O_2$", *Semiconductor International*, Dec. 1994, pp. 85–88.

Koda, Seichiro, "Kinetic Aspects of Oxidation and Combustion of Silane and Related Compounds", *Progress in Energy and Combustion Science*, vol. 18, No. 6, 1992, pp. 513–528.

Koda, S., et al., "A Study of Inhibition Effects for Silane Combustion by Additive Gases", *Combustion and Flame*, vol. 73, No. 2, 1988, pp. 187–194.

Takahashi, T., et al., "The Effect of Gas–Phase Additives $C_2H_4$, $C_2H_6$, and $C_2H_2$, on $SiH_4/O_2$ Chemical Vapor Deposition", *J. Electrochem. Soc.*, vol. 143, No. 4, Apr. 1996, pp. 1355–1361.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

McClatchie, S., et al., "Low Dielectric Constant Oxide Films Deposited Using CVD Techniques", 1998 Proceedings Fourth International DUMIC Conference, Feb. 16–17, 1998, pp. 311–318.

Peters, Laura, "Pursuing the Perfect Low–k Dielectric", *Semiconductor International*, vol. 21, No. 10, Sep. 1998, pp. 64–66, 68, 70, 72, and 74.

Tannenbaum, Stanley, et al., "Synthesis and Properties of Some Alkylsilanes", *J. Am. Chem. Soc.*, 75, Aug. 5, 1953, pp. 3753–3757.

JP App. No. 12124/97 Sony Corporation.

JP App. No. 122647/9 Sony Corporation.

\* cited by examiner

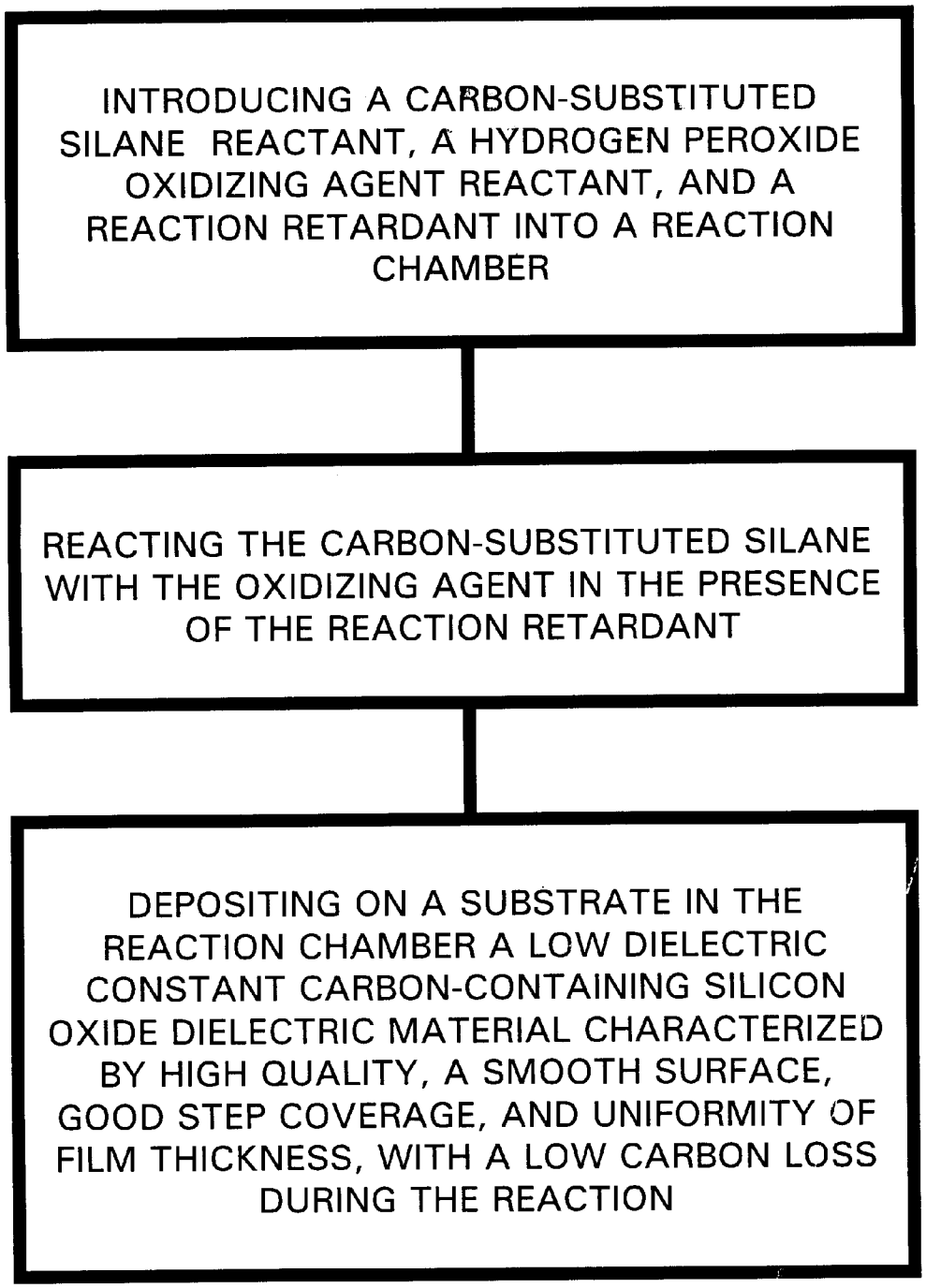

FORMATION OF IMPROVED LOW DIELECTRIC CONSTANT CARBON-CONTAINING SILICON OXIDE DIELECTRIC MATERIAL BY REACTION OF CARBON-CONTAINING SILANE WITH OXIDIZING AGENT IN THE PRESENCE OF ONE OR MORE REACTION RETARDANTS

BACKGROUND OF THE INVENTION

1. Field of the Invention

This invention relates to the formation of integrated circuit structures on semiconductor substrates. More particularly, this invention relates to the formation of a low dielectric constant carbon-containing silicon oxide dielectric material for integrated circuit structures.

2. Description of the Related Art

The shrinking of integrated circuits has resulted in levels of interconnects, including metal interconnects, being placed closer together, as well as reduction of the horizontal spacing between metal lines on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

Carbon-containing silicon oxide insulating materials formed in this manner exhibit good gap-filling capabilities and at the same time are characterized by a dielectric constant less than 3.0 and remain stable during subsequent annealing at temperatures of up to 500° C. However, to be able to deposit low k films characterized by these properties, as well as by good across-wafer and intra-wafer uniformities, the CVD process should be carried out under optimized conditions. Such optimized conditions have been found to be characterized by very narrow margins with regard to temperature, pressure, and flow rates.

In addition to thickness uniformity which sometimes varies in wide intervals, it has been found that during the formation of such low dielectric constant carbon-containing silicon oxide materials, unacceptably high carbon losses can occur during the reaction between the carbon-substituted silane and the hydrogen peroxide, i.e., carbon losses as high as 25 atomic %. It has also been found that during the reaction of the carbon-substituted silane and the hydrogen peroxide there are seemingly random spiking problems related to momentary pressure bursts. These variations can cause poor across-wafer thickness uniformity of the deposited film, as well as a "haze" or condensation problem. Sometimes the pressure spikes are high enough to actually stop the reaction by increasing the pressure in the reaction chamber sufficiently to interfere with the flow of reactants into the chamber. In any event, such pressure spiking and resultant rise in pressure can result in the precipitation of particles of the reaction product in the gas phase and their subsequent deposition on the substrate surface. This, in turn creates a mixture of flowable carbon-containing silicon oxide and solids, which can reduce the flowability of the material, resulting in an adverse effect on the step coverage of the material which can even result in the formation of voids between metal lines.

While this pressure spiking can be avoided by varying the $CH_3SiH_3/H_2O_2$ concentration ratio and/or total flows, the multi-factor character of such optimization makes it difficult to develop reliable technology by means of the process parameter variations only. Thus, the process has been found to be very sensitive to even small changes in temperature, pressure, and flow rates.

It would, therefore, be desirable to be able to make such low dielectric constant carbon-containing silicon oxide dielectric material by a process having decreased sensitivity to minor changes in temperature, pressure, and flow rates, while providing a product having uniform film thickness, a smooth surface, and low carbon loss.

SUMMARY OF THE INVENTION

The invention comprises an improvement in the formation of low dielectric constant carbon-containing silicon oxide dielectric material by reacting a carbon-substituted silane with a hydrogen peroxide oxidizing agent, wherein the process is carried out in the presence of a reaction retardant. The reaction retardant reduces the sensitivity of the reaction to changes in pressure, temperature, and flow rates, and results in the formation of a film of more uniform thickness across the substrate as well as a film with a smooth surface, with a low carbon loss during the reaction.

The reaction retardant is selected from the group consisting of:

1) an inorganic compound selected from the group consisting of: $Cl_2$, $Br_2$, $I_2$, HF, HCl, HBr, HI, NO, $NO_2$, $N_2O$, $H_2S$, CO, $CO_2$, $NH_3$, and $SO_2$, 2) an organic compound selected from the group consisting of: a 1–6 carbon alkane, a 1–6 carbon alkene, a 1–6 carbon alkyne, a 1–6 carbon alcohol, a 1–6 carbon aldehyde, a 1–6 carbon ketone, a 1–6 carbon carboxylic acid, a 1–10 carbon aromatic, and any of the above organic compounds having one or more atoms therein selected from the group consisting of Cl, Br, I, S, N, and P; and 3) mixtures of any 2 or more of the above.

BRIEF DESCRIPTION OF THE DRAWING

The sole drawing is a flowsheet illustrating the process of the invention.

DETAILED DESCRIPTION OF THE INVENTION

The invention comprises an improvement in the formation of low dielectric constant carbon-containing silicon oxide dielectric material by reacting a carbon-substituted silane with an oxidizing agent, wherein the process is carried out in the presence of a reaction retardant. The reaction retardant reduces the sensitivity of the reaction to changes in pressure, temperature, and flow rates, and results in the formation of a film of more uniform thickness across the substrate as well as a film with a smooth surface, with a low carbon loss during the reaction.

By use of the term "... film of more uniform thickness..." is meant a film having a thickness which does not vary by more that 2.5% across the area of the film. By use of the term "... film with a smooth surface..." is meant a film characterized by a reflectivity higher than 25% of the reflectivity of bare silicon. By use of the term "... with a low carbon loss during the reaction" is meant a loss of less than 10 atomic % of the carbon bonded to silicon atoms in the carbon-substituted silane reactant, as measured in the final product.

The reaction retardant is selected from the group consisting of:

1) an inorganic compound selected from the group consisting of: $Cl_2$, $Br_2$, $I_2$, HF, HCl, HBr, HI, NO, $NO_2$, $N_2O$, $H_2S$, CO, $CO_2$, $NH_3$, and $SO_2$;

2) an organic compound selected from the group consisting of: a 1–6 carbon alkane, a 1–6 carbon alkene, a 1–6 carbon alkyne, a 1–6 carbon alcohol, a 1–6 carbon aldehyde, a 1–6 carbon ketone, a 1–6 carbon carboxylic acid, a 1–10 carbon aromatic, any of the above organic compounds having one or more atoms therein selected from the group consisting of Cl, Br, I, S, N, and P; and 3) mixtures of and 2 or more of the above.

It should be noted that since the inorganic halogen-containing retardants have been found to be very powerful reaction retardants capable of completely stopping the reaction, their usage may be of particular importance when used in small amounts in combination with the organic reaction retardants.

In one embodiment, the reaction retardant comprises an organic material having the formula $C_aH_bX_c$: where a ranges from 1 to 6, b ranges from 0 to (2a+2−b), c ranges from 0 to (2a+2b), X is selected from the group consisting of Cl, Br, and I, and mixtures of Cl, Br, and I when c is 2 or more; and mixtures of any of the above. In a preferred embodiment, in the above formula: $C_aH_bX_c$ for the organic reaction retardant, the value of b ranges from 0 to (2a+1) and the value of c ranges from 1 to (2a+2−b).

The minimum amount of the reaction retardant which should be added to the reactants is that amount which will slow the reaction sufficiently to suppress the large pressure spikes which inhibit the formation of a film of uniform thickness, and which will provide a smooth surface on the film, while maintaining a carbon loss in the reaction of less than 10 atomic %. The maximum amount of the reaction retardant which should be used in the reaction is an amount below that amount which will prevent reaction between the carbon-substituted silane reactant and the hydrogen peroxide oxidizing agent to form a reaction product in the form of a film on a substrate placed in the reaction chamber. The exact amount or range of amounts for each reactor retardant or mixture of reaction retardants can be determined empirically depending upon the flow rates of the particular carbon-substituted silane and the hydrogen peroxide (and any other) oxidizing agent, and the specific reaction retardant used in the process.

The silane reactant is a carbon substituted silane reactant such as described in U.S. Pat. No. 6,303,047, issued Oct. 16, 2001, entitled "LOW DIELECTRIC CONSTANT MULTIPLE CARBON-CONTAINING SILICON OXIDE DIELECTRIC MATERIAL FOR USE IN INTEGRATED CIRCUIT STRUCTURES, AND METHOD OF MAKING SAME", which was filed on the same day as this application, now U.S. Pat. No. 6,303,047 and is assigned to the assignee of this application. Carbon-substituted silanes identified therein which may be used with the reaction retardant of the present invention include: 1,1-dimethyl ethyl silane, 1,1,2, 2-tetramethyl propyl silane, 1,1,2,2,3,3-hexamethyl butyl silane, 1,1,2,2,3,3,4,4-octamethyl pentyl silane, 1,2,2,3,3-pentamethyl cyclopropyl silane, 1,2,2,3,3,4,4-heptamethyl cyclobutyl silane, 1,2,2,3,3,4,4,5,5-nonamethyl cyclopentyl, as well as n-propyl silane, isopropyl (1-methylethyl) silane, n-butyl silane, isobutyl (2-methyl propyl) silane, and methylenebis-silane.

The oxidizing agent used in the process will comprise hydrogen peroxide. However, while hydrogen peroxide is used as the oxidizing agent reactant in the reaction with the carbon-substituted silane, in view of the presence of the reaction retardant of the invention, other oxidizing agents such as $O_2$, $O_3$, and combinations of same may, in some instances, be found to be useful in combination with the hydrogen oxide oxidizing agent. Such usage of other oxidizing agents should, however, be limited, to amount less than 50 volume % of the total amount of oxidizing agents used in the reaction, with the remainder of the oxidizing agent, i.e., over 50 volume %, comprising hydrogen peroxide. The ratio of the flows of the hydrogen peroxide oxidizing agent to the carbon substituted silane will usually range from about 5:1 to about 10:1.

The pressure within the reaction chamber during the reaction should be maintained within a range of from about 0.1 Torr to about 50 Torr, preferably from about 1 Torr to about 10 Torr, and most preferably from about 1 Torr to about 5 Torr. The silane, the oxidizing agent, and the reaction retardant may each be introduced into the reaction chamber in a gaseous phase. The delivery system for the reactants is maintained at a temperature of from about 70° C. to about 100° C. to ensure delivery of the reactants into the chamber as gases or vapors. During the reaction and deposition, the temperature of the substrate in the reaction chamber is maintained below ambient (~25° C.), and preferably below about 10° C., to avoid fast cross-linking of the reaction product as it forms. The reaction is carried out for a period of time sufficient to form the desired layer of low dielectric constant silicon oxide dielectric material to the desired thickness over the integrated circuit structure already formed on the substrate. Usually this thickness will range from a minimum of about 300 nm, to ensure sufficient electrical insulation between underlying conductive regions and conductive regions to be formed over the low k dielectric material, up to a maximum of about 1500 nm. Thicker layers can be formed, but are deemed unnecessary and merely add to the bulk of the structure.

While it is not the intent to be bound by any particular theory of operation, it is believed that the sensitivity of the silane oxidation reaction can be understood from the physical chemical nature of the process. The basic reaction between $SiH_4$ and $O_2$ is an example of a branching-radical chain reaction wherein the reaction between the two reactants is catalyzed by gas-phase active radicals such as O., OH., and H., which, in turn, are produced by the reaction between the $SiH_4$ and $O_2$ reactants. Therefore the reaction system is characterized by a positive-feedback nature. The same branching-radical chain reaction occurs in the case of $CH_3SiH_3/H_2O_2$. But in this case, the heterogeneous decomposition of hydrogen peroxide ($H_2O_2$.) should be considered as a major source of peroxy radicals ($HO_2$.) that initiate the chain. Indeed the low temperature of the delivery system (70° C. to 100° C.) prevents premature decomposition of the hydrogen peroxide in the gas phase. At the same time, discussions in the literature concerning the radical mechanism of $_2O_2$ decomposition on metal oxide surfaces can explain formation of peroxy radicals ($HO_2$.) in the gas phase above the adjacent surfaces. The ratio between the rate constants for the chain propagation and termination of the $HO_2$. radical will then define the possibility of the chain ignition and explosion limit of, for example, methyl silane. Simulation results show that the high values of rate constants of the $HO_2$. radical with $SiH_4$ and $SiH_2O$ used in kinetic models describing the $SiH_4/O_2$ system, lead to chain propagation through the $HO_2$. radical. A similar mechanism appears to be valid for the $CH_3SiH_3/H_2O_2$ system as well. Initially, the methyl silane reacts with the peroxy radical and is converted into a methyl silyl radical ($CH_3SiH_2$.). A disproportion reaction between two $HO_2$. radicals leads to a molecular oxygen release. A following reaction between oxygen and $CH_3SiH_2$. produces oxygenated silicon compounds, which are precursors for silicon dioxide formation, and generates reactive radicals (O., OH., and H.). The generated radicals, in turn, react with methyl silane accelerating the overall reaction. If the amount of generated radicals becomes larger that the amount of consumed radicals, one has all the ingredients for a chain initiated explosion. This self-ignition phenomenon is believed to be responsible for the pressure spiking observed in a wide range of the process parameters used in the CVD formation of the low k silicon oxide dielectric material. The same gas phase chain ignition can also explain the "haze" problem which causes rough film deposition. The gas phase reaction accelerates rapidly, forming clusters that deposit and produce rough films. The reaction retardants of the invention are believed to inhibit this self-ignition phenomenon by acting as radical scavengers which react with the radicals involved in chain branching, thereby reducing the population of such radicals.

The term "radical scavengers", as used herein, is intended to define a reaction retardant which will react with the radical species, but not with the carbon-substituted silane reactant. Preferably the reaction scavenger will react more readily with the radical species than the radical species reacts with the carbon-substituted silane reactant.

To further illustrate the practice of the invention, CVD formation of a low k carbon-containing silicon oxide dielectric material on silicon substrates (having previously formed thereon identical patterns of metal lines) may be carried out in two comparative processes under identical reaction conditions using methyl silane ($CH_3$—$SiH_3$) and hydrogen peroxide ($H_2O_2$) reactants, including a reaction chamber pressure of about 1–5 Torr, a reaction temperature just below about 10° C., and flow rates of about 100 sccm of methyl silane, 400 sccm hydrogen peroxide, and about 1–10 sccm $CH_3I$ into a 10 liter chamber. In one case, however, the reaction and deposition is carried out in the presence of an effective amount of $CH_3I$ as a reaction retardant, while the other reaction and deposition is carried out as a control without the use of such a reaction retardant.

When the resulting deposited films of carbon-containing silicon oxide are respectively examined, it will be found that the surface of the film deposited in the reaction containing the reaction retardant is a smooth surface, while the surface of the control film is not smooth, but rather is rough and hazy. Furthermore, sectioning of the respective films will show that the control film varies in thickness by as much as 15% from one portion to another, while the variations in film thickness of the carbon-containing low k silicon oxide dielectric material formed in accordance with the invention in the presence of the $CH_3I$ reaction retardant are not greater than 5%. Analysis of the carbon loss during the respective reactions will show a carbon loss of less than 10 atomic % for the carbon-containing low k silicon oxide dielectric material formed in accordance with the invention in the presence of the $CH_3I$ reaction retardant, while the control film will show a loss of more than 25 atomic % of the carbon in the carbon-substituted silane reactant. The substrate having the carbon-containing low k silicon oxide dielectric material thereon formed in accordance with the invention will have better step coverage that the control film with no evidence of void formation.

Thus, the invention comprises an improvement in the process for forming a film of low k carbon-containing silicon oxide dielectric material wherein the reactants comprise not only an oxidizing agent and a carbon-substituted silane, but also include a reaction retardant, resulting in enhanced uniformity of deposited film thickness on a substrate as well as improvements in the smoothness of the surface of the resulting deposited film, and reduction in the amount of carbon lost during the reaction.

Having thus described the invention what is claimed is:

1. A process for forming a film of low dielectric constant carbon-containing silicon oxide dielectric material by reacting a carbon-substituted silane with an oxidizing agent comprising hydrogen peroxide in a reaction chamber, which comprises reacting together:
    a) an oxidizing agent comprising over 50 volume % hydrogen peroxide and less than 50 volume % of one or more additional oxidizing agents selected from the group consisting of $O_2$, $O_3$, and mixtures thereof; and
    b) a multiple carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group;
in the presence of a reaction retardant selected from the group consisting of:
    a) an inorganic compound selected from the group consisting of: $Cl_2$, $Br_2$, $I_2$, HF, HCl, HBr, HI, NO, $NO_2$, $N_2O$, $H_2S$, CO, $CO_2$, $NH_3$, and $SO_2$;
    b) an organic compound selected from the group consisting of: a 1–6 carbon alkane, a 1–6 carbon alkene, a 1–6 carbon alkyne, a 1–6 carbon alcohol, a 1–6 carbon aldehyde, a 1–6 carbon ketone, a 1–6 carbon carboxylic acid, a 1–10 carbon aromatic, and any of
    c) any of the above organic compounds having one or more atoms therein selected from the group consisting of Cl, Br, I, S, N, and P; and
    d) mixtures of any 2 or more of the above.

2. The process of claim 1 wherein said carbon-substituted silane is selected from the group consisting of ethyl silane, n-propyl silane, isopropyl (1-methylethyl) silane, n-butyl silane, isobutyl (2-methyl propyl) silane, phenyl silane, methylenebis-silane, 1,1-dimethyl ethyl silane, 1,1,2,2- tetramethyl propyl silane, 1,1,2,2,3,3-hexamethyl butyl silane, 1,1,2,2,3,3,4,4-octamethyl pentyl silane, 1,2,2,3,3-pentamethyl cyclopropyl silane, 1,2,2,3,3,4,4-heptamethyl cyclobutyl silane, and 1,2,2,3,3,4,4,5,5-nonamethyl cyclopentyl.

3. The process of claim 1 wherein said carbon-substituted silane is selected from the group consisting of: 1,1,2,2-tetramethyl propyl silane, 1,1,2,2,3,3-hexamethyl butyl silane, 1,1,2,2,3,3,4,4-octamethyl pentyl silane, 1,2,2,3,3-pentamethyl cyclopentyl silane, 1,2,2,3,3,4,4-heptamethyl cyclobutyl silane, and 1,2,2,3,3,4,4,5,5-nonamethyl cyclopentyl.

4. A process for forming a film of low dielectric constant carbon-containing silicon oxide dielectric material by reacting a carbon-substituted silane with an oxidizing agent comprising hydrogen peroxide in a reaction chamber, which comprises reacting together:
  a) an oxidizing agent comprising over 50 volume % hydrogen peroxide and less than 50 volume % of one or more additional oxidizing agents selected from the group consisting of $O_2$, $O_3$, and mixtures thereof; and
  b) a multiple carbon-substituted silane having only primary hydrogens bonded to the carbon atoms and having the formula $SiH_x((C)_y(CH_3)_x)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group;
in the presence of a reaction retardant having the formula: $C_aH_bX_c$, where a ranges from 1 to 6, b ranges from 0 to (2a+2), c ranges from 0 to (2a+2−b), and X is selected from the group consisting of: Cl, Br, I; and mixtures of Cl, Br, and I when c is 2 or more.

5. The process of claim 4 wherein the value of c in the reaction retardant formula ranges from 1 to (2a+2−b).

6. In the formation of a film of low dielectric constant carbon-containing silicon oxide dielectric material by reacting together:
  a) an oxidizing agent comprising hydrogen peroxide in a reaction chamber, and
  b) a carbon-substituted silane having only primary hydrogens bonded to the carbon atoms and having the formula $SiH_x((C)_y(CH_3)_z)_{(4-x)}$, where x ranges from 1 to 3, y is an integer from 1 to 4 for a branched alkyl group and from 3 to 5 for a cyclic alkyl group, and z is 2y+1 for a branched alkyl group and 2y−1 for a cyclic alkyl group;
  the improvement which comprises carrying out the reaction in the presence of a reaction retardant capable of improving the uniformity of the deposited film thickness and smoothness of the surface of the film, while lowering the carbon loss during said reaction, said reaction retardant selected from the group consisting of:
  a) an inorganic compound selected from the group consisting of: $Cl_2$, $Br_2$, $I_2$, HF, HCl, HBr, HI, $N_2$, NO, $NO_2$, $N_2O$, $H_2S$, CO, $CO_2$, $NH_3$, and $SO_2$;
  b) an organic compound selected from the group consisting of: a 1–6 carbon alkane, a 1–6 carbon alkene, a 1–6 carbon alkyne, a 1–6 carbon alcohol, a 1–6 carbon aldehyde, a 1–6 carbon ketone, a 1–6 carbon carboxylic acid, a 1–10 carbon aromatic;
  c) and any of the above organic compounds having one or more atoms therein selected from the group consisting of Cl, Br, I, S, N, and P; and
  d) mixtures of any 2 or more of the above.

7. The process of claim 6 wherein said carrying out of said reaction in the presence of said reaction retardant capable of improving the uniformity of the deposited film thickness, and smoothness of the surface of the film, while lowering the carbon loss during the reaction further comprises carrying out said process in the presence of a reaction retardant consisting of an organic compound selected from the group consisting of: a 1–6 carbon alkane, a 1–6 carbon alkene, a 1–6 carbon alkyne, a 1–6 carbon alcohol, a 1–6 carbon aldehyde, a 1–6 carbon ketone, a 1–6 carbon carboxylic acid, a 1–10 carbon aromatic, and any of the above organic compounds having one or more atoms therein selected from the group consisting of Cl, Br, I, S, N, and P.

8. The process of claim 6 wherein said carrying out of said reaction in the presence of said reaction retardant capable of improving the uniformity of the deposited film thickness, and smoothness of the surface of the film, while lowering the carbon loss during the reaction further comprises carrying out said process in the presence of a reaction retardant consisting of an organic material having the formula $C_aH_bX_c$: where a ranges from 1 to 6, b ranges from 0 to (2a+2), c ranges from 0 to (2a+2−b), and X is selected from the group consisting of: F, Cl, Br, I; and mixtures of Cl, Br, and I when c is 2 or more.

9. The process of claim 6 wherein said carrying out of said reaction in the presence of said reaction retardant capable of improving the uniformity of the deposited film thickness, and smoothness of the surface of the film, while lowering the carbon loss during the reaction further comprises carrying out said process in the presence of a reaction retardant consisting of an organic material having the formula $C_aH_bX_c$, where a ranges from 1 to 6, b ranges from 0 to (2a+1), c ranges from 1 to (2a+2−b), and X is selected from the group consisting of: F, Cl, Br, I; and mixtures of Cl, Br, and I when c is 2 or more.

10. A process forming a film of low dielectric constant carbon-containing silicon oxide dielectric material by reacting together, in a reaction chamber:
  a) a multi carbon-substituted silane having carbon atoms bonded to a single carbon atom and three primary hydrogen atoms; and
  b) an oxidizing agent comprising hydrogen peroxide;
in the presence of a reaction retardant capable of improving the uniformity of the deposited film thickness and smoothness of the surface of the film, while lowering the carbon loss during said reaction, said reaction retardant selected from the group consisting of: $Cl_2$, $Br_2$, $I_2$, HCl, HBr, HI, $N_2$, NO, $NO_2$, $N_2O$, $H_2S$, CO, $CO_2$, $NH_3$, and $SO_2$.

* * * * *